United States Patent
Mitamura et al.

(10) Patent No.: US 10,409,164 B2
(45) Date of Patent: Sep. 10, 2019

(54) HEAT-REACTIVE RESIST MATERIAL, MOLD MANUFACTURING METHOD, MOLD, DEVELOPMENT METHOD AND PATTERN FORMATION MATERIAL

(71) Applicant: ASAHI KASEI KABUSHIKI KAISHA, Tokyo (JP)

(72) Inventors: Yoshimichi Mitamura, Tokyo (JP); Takuto Nakata, Tokyo (JP)

(73) Assignee: ASAHI KASEI KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/027,034

(22) Filed: Jul. 3, 2018

(65) Prior Publication Data
US 2018/0314159 A1 Nov. 1, 2018

Related U.S. Application Data

(62) Division of application No. 14/359,869, filed as application No. PCT/JP2012/079784 on Nov. 16, 2012, now abandoned.

(30) Foreign Application Priority Data

Nov. 22, 2011 (JP) ................................. 2011-254839
Jul. 3, 2012 (JP) ................................. 2012-149834

(51) Int. Cl.
*B29C 33/38* (2006.01)
*G03F 7/38* (2006.01)
(Continued)

(52) U.S. Cl.
CPC ............ *G03F 7/38* (2013.01); *B29C 33/3857* (2013.01); *B29C 59/022* (2013.01); *B82Y 10/00* (2013.01);
(Continued)

(58) Field of Classification Search
CPC ........ G03F 7/38; G03F 7/0002; G03F 7/0043; G03F 7/32; G03F 7/322; B29C 33/3857;
(Continued)

(56) References Cited

U.S. PATENT DOCUMENTS 3,620,736 A * 11/1971 Tarkington ................ G03F 7/00
430/323
2011/0195142 A1 8/2011 Mitamura et al.
2013/0026134 A1 1/2013 Nakagawa et al.

FOREIGN PATENT DOCUMENTS

EP 2 657 299 A1 10/2013
EP 2 690 650 A1 1/2014
(Continued)

OTHER PUBLICATIONS

International Search Report, issued in PCT/JP2012/079784, dated Feb. 5, 2013.
(Continued)

*Primary Examiner* — Timothy Kennedy
*Assistant Examiner* — John Robitaille
(74) *Attorney, Agent, or Firm* — Birch, Stewart, Kolasch & Birch, LLP (57) ABSTRACT

A heat-reactive resist material contains copper oxide, and silicon or silicon oxide, and is formed so that the content of silicon or silicon oxide in the heat-reactive resist material is 4.0 mol % or more less than 10.0 mol % in terms of mole of silicon. A heat-reactive resist layer is formed using the heat-reactive resist material, is exposed, and then, is developed with a developing solution. Using the obtained heat-reactive resist layer as a mask, dry etching is performed on a substrate with a fluorocarbon to manufacture a mold having a concavo-convex shape on the substrate surface. At this point, it is possible to control a fine pattern comprised of the concavo-convex shape.

3 Claims, 3 Drawing Sheets

(51) Int. Cl.
*G03F 7/00* (2006.01)
*B29C 59/02* (2006.01)
*C04B 35/45* (2006.01)
*B82Y 10/00* (2011.01)
*B82Y 40/00* (2011.01)
*G03F 7/004* (2006.01)
*G03F 7/32* (2006.01)
*G11B 7/26* (2006.01)
*B29C 33/42* (2006.01)
*G11B 7/14* (2012.01)

(52) U.S. Cl.
CPC ............. *B82Y 40/00* (2013.01); *C04B 35/45* (2013.01); *G03F 7/0002* (2013.01); *G03F 7/0043* (2013.01); *G03F 7/32* (2013.01); *G03F 7/322* (2013.01); *G11B 7/261* (2013.01); *B29C 33/424* (2013.01); *B29C 2059/023* (2013.01); *G03F 7/0017* (2013.01); *G11B 7/14* (2013.01)

(58) Field of Classification Search
CPC ....... B29C 59/022; B82Y 10/00; B82Y 40/00; C04B 35/45; G11B 7/261
See application file for complete search history.

(56) References Cited

FOREIGN PATENT DOCUMENTS

| | | |
|---|---|---|
| EP | 2 752 895 A1 | 7/2014 |
| JP | 2012-93677 A | 5/2012 |
| JP | 2012-128353 A | 7/2012 |
| WO | WO 2010/044400 A1 | 4/2010 |
| WO | WO 2011/105129 A1 | 9/2011 |

OTHER PUBLICATIONS

Ishizuka et al., "Control of hole carrier density of polycrystalline $Cu_2O$ thin films by Si doping," Applied Physics Letters, vol. 80, No. 6, Feb. 11, 2002, pp. 950-952.

Ishizuka et al., "Control of the growth orientation and electrical properties of polycrystalline $Cu_2O$ thin films by group-IV elements doping," Applied Physics Letters, vol. 85, No. 21, Nov. 22, 2004, pp. 4920-4922.

Supplementary European Search Report completed Mar. 3, 2015, in European Patent Application No. 12851615.

\* cited by examiner

FIG. 4

HEAT-REACTIVE RESIST MATERIAL, MOLD MANUFACTURING METHOD, MOLD, DEVELOPMENT METHOD AND PATTERN FORMATION MATERIAL

CROSS-REFERENCE TO RELATED APPLICATION

This application is a Divisional application of copending application Ser. No. 14/359,869, filed May 21, 2014, which is the National Phase under 35 U.S.C. § 371 of International Application No. PCT/JP2012/079784, filed on Nov. 16, 2012, which claims the benefit under 35 U.S.C. § 119 (a) to Patent Application No. 2011-254839, filed in Japan on Nov. 22, 2011 and Patent Application No. 2012-149834, filed in Japan on Jul. 3, 2012, all of which are hereby expressly incorporated by reference into the present application.

TECHNICAL FIELD

The present invention relates to a heat-reactive resist material, mold manufacturing method, mold, development method and pattern formation material.

BACKGROUND ART

In recent years, in the fields of semiconductor, optical•magnetic recording, etc., as demands for higher density, higher integration and others have increased, techniques have become essential for fine pattern processing of about several hundreds to tens of nanometers or less.

As a heat-reactive resist material used in fine pattern processing, the inventors of the present invention disclose materials with high dry etching resistance enabling the pattern size of uniform concavities and convexities, the shape of a line and the like to be controlled (for example, see Patent Document 1). Further, as a developing solution used in the exposure•development process of such resist materials, the inventors of the invention disclose using amino acid, chelating agent and the like (for example, see Patent Document 2).

PRIOR ART DOCUMENT

Patent Document

[Patent Document 1] International Publication No. 2010/044400 Pamphlet
[Patent Document 2] International Publication No. 2011/105129 Pamphlet

DISCLOSURE OF INVENTION

Problems to be Solved by the Invention

It is possible to study optimal additive amounts more excellent in manufacturing stability on additive amounts of silicon oxide and silicon in the heat-reactive resist materials as described in Patent Documents 1 and 2.

The present invention was made in view of such a respect, and it is an object of the invention to provide a heat-reactive resist material, mold manufacturing method, mold, development method and pattern formation material for enabling a fine pattern to be controlled.

Means for Solving the Problem

A heat-reactive resist material of the present invention is a heat-reactive resist material containing copper oxide, and silicon or silicon oxide, and is characterized in that the content of the silicon or the silicon oxide in the heat-reactive resist material is 4.0 mol % or more less than 10.0 mol % in terms of mole of silicon.

A manufacturing method of a mold of the invention is a manufacturing method for manufacturing a mold having a concavo-convex shape on a substrate surface using the heat-reactive resist material of the invention as described above, and is characterized by including a step (1) of forming a heat-reactive resist layer on the substrate using the heat-reactive resist material, a step (2) of exposing the heat-reactive resist layer, and then, developing with a developing solution, a step (3) of performing dry etching on the substrate with a fluorocarbon using the heat-reactive resist layer as a mask, and a step (4) of removing the heat-reactive resist layer, where the developing solution is a glycine solution or a mixed solution of glycine and ammonium oxalate.

A development method of the invention is a development method for developing the heat-reactive resist material of the invention as described above, and is characterized by including a step (1) of forming a heat-reactive resist layer on a substrate using the heat-reactive resist material, and a step (2) of exposing the heat-reactive resist layer, and then, developing with a developing solution, where the developing solution is a glycine solution or a mixed solution of glycine and ammonium oxalate.

A pattern formation material of the invention is characterized by being comprised of a combination of the heat-reactive resist material of the invention as described above, and a developing solution comprised of a glycine solution or a mixed solution of glycine and ammonium oxalate.

Advantageous Effect of the Invention

According to the present invention, when copper oxide is selected for a heat-reactive resist material, by adding an optimum amount of silicon or silicon oxide, it is possible to provide the heat-reactive resist material excellent in manufacturing stability such that pattern roughness (pattern fluctuations) of the resist is suppressed to be excellent and that a development difference between heated portions and unheated portions tends to occur, and to provide the mold manufacturing method using the material, mold, development method and pattern formation material.

BEST MODE FOR CARRYING OUT THE INVENTION

An Embodiment of the present invention will specifically be described below.

A heat-reactive resist material according to one Embodiment of the present invention is characterized by containing copper oxide, and silicon or silicon oxide, where an additive amount of silicon or silicon oxide to copper oxide is 4.0 mol % or more less than 10.0 mol % in terms of mole of silicon.

The copper oxide that is a component of the heat-reactive resist material changes by heat due to exposure or the like, thereby makes a development rate difference between heated portions and unheated portions by a developing solution, and enables pattern formation. However, in the case of using copper oxide alone (a state in which silicon or silicon oxide is not added) as a resist material, crystallization of copper oxide proceeds by heat due to exposure or the like, and coarse particles of copper oxide are formed. The absence of coarse particles is preferable to suppress roughness of the pattern and form the excellent pattern. Further, also to make the pattern fine, the absence of coarse particles is preferable. Therefore, as an additive to suppress crystallization of copper oxide, silicon or silicon oxide is added. Silicon or silicon oxide is compatible with copper oxide little, thus enables crystallization of copper oxide to be suppressed by the pinning effect, and thereby enables formation of coarse particles to be suppressed. Thus, as an additive to suppress crystallization of copper oxide, silicon or silicon oxide is optimal.

Further, copper oxide changes (decomposes) from copper (II) oxide to copper(I) oxide at high temperatures, a phenomenon of reoxidation occurs in the cooling process from high temperatures to room temperature, and a part of copper (I) oxide generated by decomposition is oxidized to recover to copper(II) oxide. As a result, the difference in the chemical composition becomes a little between the heated portions and the unheated portions, and the problem occurs that the development difference is a little. For the problem, by adding silicon or silicon oxide to copper oxide, it is also possible to suppress reoxidation of copper(I) oxide generated by decomposition, and to prevent the development difference from decreasing.

The additive amount of silicon or silicon oxide required to suppress crystallization of copper oxide is 4.0 mol % or more, preferably 4.5 mol % or more, more preferably 5.5 mol % or more, and most preferably 6.5 mol % or more.

Figure 1:
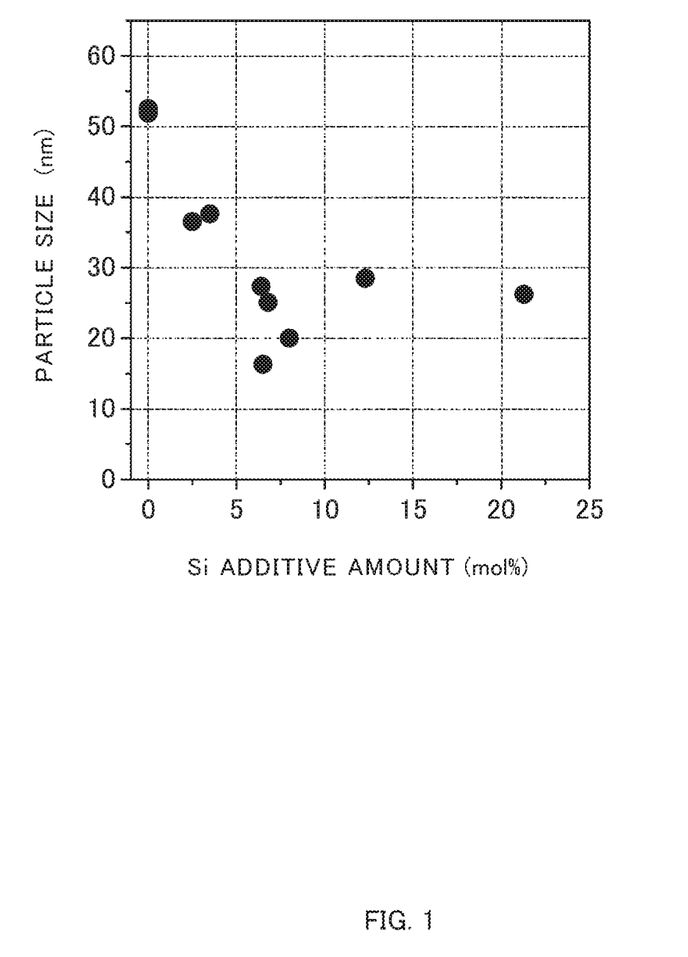
FIG. 1 is a graph showing the relationship between a silicon additive amount and a particle diameter of copper oxide.

FIG. 1 is a graph showing the relationship between a silicon additive amount and a particle diameter of copper oxide. As shown in FIG. 1, within the additive amount of silicon or silicon oxide ranging from 0 to 4 mol %, the crystal particle diameter of copper oxide decreases monotonously. Accordingly, the additive amount of silicon or silicon oxide is selected corresponding to a required pattern form. Meanwhile, in the case of adding silicon or silicon oxide in an amount of 4.0 mol % or more, since the crystal particle diameter of copper oxide does not change significantly, a large additive amount does not cause any problem, but has little effect in the viewpoint of crystal particle diameter suppression.

The additive amount of silicon or silicon oxide required to suppress reoxidation of copper(I) oxide is 0.01 mol % or more, preferably 0.5 mol % or more, and more preferably 1.0 mol % or more. In other words, it is possible to sufficiently exert the effect of reoxidation suppression with the additive amount of silicon or silicon oxide added to suppress crystallization.

Figure 2:
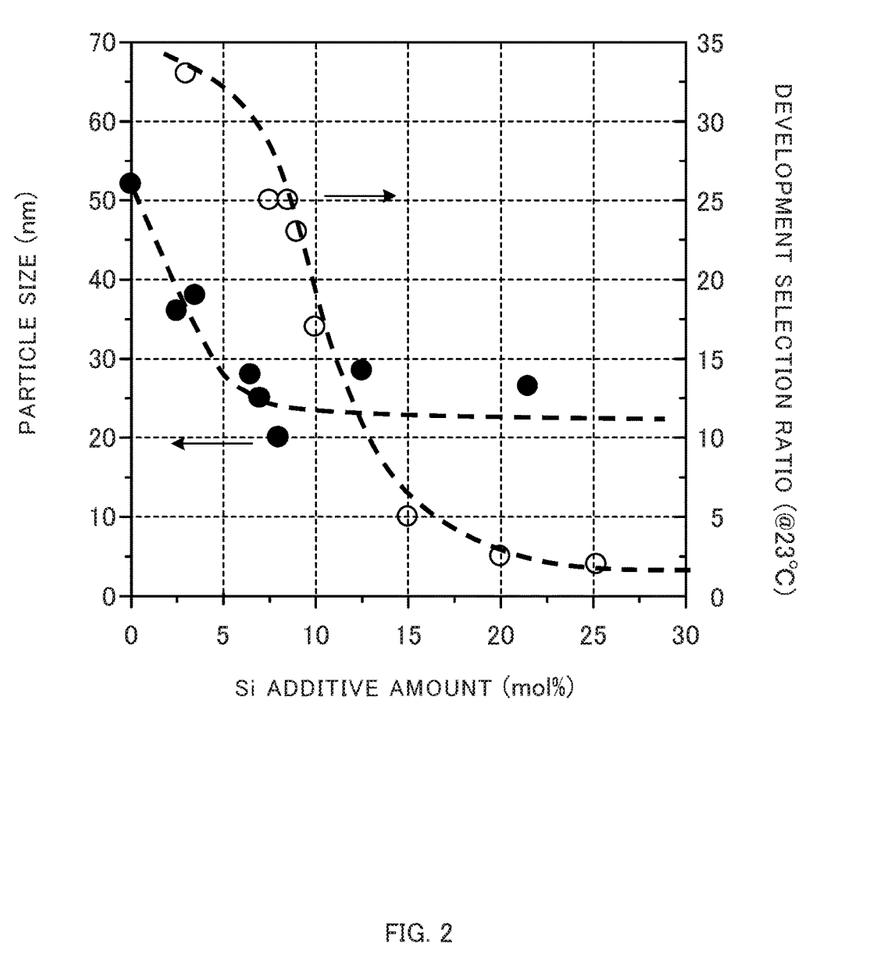
FIG. 2 is a graph showing the relationship between a particle diameter of copper oxide and a development selection ratio relative to the silicon additive amount.

Further, in the relationship between the additive amount of silicon or silicon oxide and a glycine solution or ammonium oxalate aqueous solution that is a developing solution, when the additive amount of silicon or silicon oxide exceeds 10.0 mol %, such a phenomenon occurs that the development difference gradually decreases between the heated portions and the unheated portions. Accordingly, to form a fine pattern with stability, it is necessary to provide the additive amount with an upper limit. In other words, the additive amount of silicon or silicon oxide is less than 10.0 mol %, preferably 9.5 mol % or less, more preferably 9.0 mol % or less, and most preferably 8.5 mol % or less. By setting the additive amount of silicon or silicon oxide within the above-mentioned range, it is possible to obtain heat-reactive resist materials that tend to cause the development difference and that are excellent in manufacturing stability. An index of the development difference is represented as a selection ratio (value obtained by dividing the development rate of the heated portions by the development rate of the unheated portions), and as the selection ratio increases, manufacturing stability is more excellent. FIG. 2 is a graph showing the relationship between the particle diameter of copper oxide and the development selection ratio relative to the silicon additive amount. As can be seen from FIG. 2, there is a tendency that the selection ratio decreases when the additive amount of silicon or silicon oxide exceeds 10 mol %. Therefore, the selection ratio is preferably 5 or more, more preferably 10 or more, and most preferably 20 or more.

As described above, from the reasons that pattern roughness of the resist is excellent and that the development difference between the heated portions and the unheated portions is large to make manufacturing stability excellent, the additive amount of silicon or silicon oxide to add to copper oxide constituting the heat-reactive resist material according to this Embodiment is 4.0 mol % or more less than 10.0 mol %, preferably in the range of 4.5 mol % to 9.5 mol %, more preferably in the range of 5.5 mol % to 9.0 mol %, and most preferably in the range of 6.5 mol % to 8.5 mol %.

The preferable ranges of the additive amount of silicon or silicon oxide and their reasons will specifically be described below. First, as a lower limit, when the additive amount is 4.0 mol % or more, it is possible to suppress crystallization of copper oxide and suppress reoxidation of copper(I) oxide.

In making crystallization suppression of copper oxide i.e. the particle size of copper oxide an index, as described previously, the particle diameter of copper oxide does not change significantly in the case of adding silicon or silicon oxide in an amount of 4.0 mol % or more. Accordingly, to effectively decrease the particle diameter, it is preferable to add silicon or silicon oxide in an amount of 4.0 mol % or more. In addition, as shown in FIG. 2, within the range of 4.0 mol % or more of silicon or silicon oxide, the particle diameter shows the tendency that the particle diameter gently decreases with variations of some extent. It is conceivable that the variations of the particle diameter are caused by the distribution of the dispersion state of silicon or silicon oxide in copper oxide. Accordingly, a larger amount of silicon or silicon oxide is preferable in the case of intending to make the particle diameter finer or to uniform the distribution of the dispersion state of silicon or silicon oxide in copper oxide.

In view of the foregoing, the additive amount of silicon or silicon oxide of 4.5 mol % or more is excellent in the case of intending to make the particle diameter finer or to uniform the distribution of the dispersion state of silicon or silicon oxide in copper oxide.

Further, the additive amount of 5.5 mol % or more is more excellent in the case of intending to make the particle diameter finer or to uniform the distribution of the dispersion state of silicon or silicon oxide in copper oxide.

On the other hand, as an upper limit, when the additive amount is less than 10 mol %, it is possible to suppress the phenomenon that the development difference gradually decreases between the heated portions and the unheated portions. In other words, in the development select ion ratio, it is possible to obtain the selection ratio of 20 or more. By obtaining the development selection ratio of 20 or more, since manufacturing stability is excellent, it is possible to set a wider control window, repetition reproducibility is excellent, and such a ratio is extremely effective in developing a large area.

Further, the additive amount of 9.5 mol % or less enables a higher development selection ratio of about 21 to be obtained, and is more excellent in manufacturing stability.

Furthermore, the additive amount of 9.0 mol % or less enables a higher development selection ratio of about 23 to be obtained, and is further excellent in manufacturing stability.

Still furthermore, the additive amount of 8.5 mol % or less enables a higher development selection ratio of about 25 to be obtained, and is the most excellent in manufacturing stability.

In view of the foregoing, in the case of placing importance on repetition reproducibility and manufacturing stability in developing a large area, the additive amount of silicon or silicon oxide preferably ranges from 4.0 mol % to 8.5 mol %. Meanwhile, in the case of intending to placing importance on formation of excellent pattern roughness and formation of a finer pattern, the additive amount of silicon or silicon oxide is preferably 6.5 mol % or more less than 10.0 mol %. In addition, in the case of placing importance on manufacturing stability, formation of excellent pattern roughness, and formation of a finer pattern, the additive amount of silicon or silicon oxide preferably ranges from 6.5 mol % to 8.5 mol %.

In addition, the heat-reactive resist material of the present invention is characterized by containing copper oxide and silicon or silicon oxide i.e. containing copper oxide and silicon, or containing copper oxide and silicon oxide, and is characterized in that the oxidation degree of silicon to add is in the range of 0 to 2. Described herein is silicon with the oxidation degree lower than perfect oxide (with the degree of oxidation of 2) i.e. silicon suboxide. When the oxidation degree is near perfect oxide, silicon suboxide is capable of existing in a state where oxygen is lost from the crystalline structure of perfect oxide. However, when the oxidation degree further decreases, since it is difficult to keep the crystalline structure, generally, silicon suboxide often exists as a mixture of silicon and silicon oxide. Accordingly, the silicon oxide of the invention includes the case where the oxidation degree is low i.e. the case of a mixture of silicon and silicon oxide. Accordingly, even in a state in which copper oxide, silicon, and silicon oxide are mixed, there is not any problem as long as the additive amount of silicon is within the above-mentioned range.

Further, unit mol % representing the range of the additive amount of silicon or silicon oxide is a value expressed in percent of a value obtained by dividing the number of moles of silicon (Si) by the total number of moles of copper (Cu) and silicon (Si). Further, as the expression method other than mol %, at % exists. at % is a unit expressed in percent of the number of atoms, and in the present invention, mol % and at % express equal meaning.

In the heat-reactive resist material according to this Embodiment, it is preferable that copper oxide and a part of silicon or silicon oxide interact with each other. Herein, it is possible to confirm the presence or absence of interaction by observing binding energy of 2P of Si by XPS (X-ray Photoelectron Spectroscopy) analysis. Normally, binding energy of 2P of Si in silicon alone or silicon oxide alone is observed near 99.5 eV or 103.5 eV, respectively. On the other hand, in performing analysis of 2P of Si contained in the heat-reactive resist material according to this Embodiment, binding energy is observed near 100.0 to 102.5 eV. The observed binding energy of 2P of Si is binding energy between silicon alone and silicon oxide alone, and therefore, the possibility of silicon suboxide is suggested. However, since SiOx (1<X<2) generally exists only as a gas at high temperatures, the possibility does not agree with the observation result in a thin film at room temperature. Accordingly, it is conceivable that the shift in binding energy suggests that silicon atoms have interaction with copper oxide. Accordingly, by XPS analysis, in the heat-reactive resist material according to this Embodiment, it is confirmed that copper oxide interacts with apart of silicon or silicon oxide, and it can be said that the material is preferable as a heat-reactive resist material.

A film thickness of a thin film comprised of the heat-reactive resist material according to this Embodiment preferably ranges from 10 nm to 50 nm. Heating of the heat-reactive resist material is achieved by the heat-reactive resist material absorbing light by exposure or the like to transform into heat. Accordingly, to achieve heating, the heat-reactive resist material needs to absorb light, and this absorption amount of light is significantly dependent on the film thickness. When the film thickness of the thin film comprised of the heat-reactive resist material is 10 nm or more, since the light absorption amount is large, the material is easier to heat efficiently. Accordingly, the film thickness of the thin film comprised of the heat-reactive resist material of the invention is preferably 10 nm or more. In addition, even when the film thickness is thin, it is possible to compensate for the light absorption amount by providing both upper and lower sides. Also, it is possible to compensate for the light absorption amount by providing both upper and lower sides or one of the sides of the thin film comprised of the heat-reactive resist material with a light absorption layers and the like.

On the other hand, when the film thickness of the thin film comprised of the heat-reactive resist material is 50 nm or less, it is easier to ensure uniformity in the film thickness direction by exposure. In other words, not only in the depth direction, processing accuracy of the fine pattern is also preferable in the film surface direction. In view of the foregoing, the film thickness of the thin film comprised of the heat-reactive resist material preferably ranges from 10 nm to 50 nm, and more preferably ranges from 20 nm to 30 nm. By setting the film thickness of the thin film comprised of the heat-reactive resist material within the most preferable range of 20 nm to 30 nm, there are advantages that the light absorption amount by exposure or the like is appropriate, and that it is possible to maintain uniformity of heat in the film thickness direction and the film depth direction, and further, there are advantages that since the rate of change in the light absorption amount is low with respect to a change in the film thickness, the unevenness of heat does not tend to occur even when the unevenness of the film thickness occurs, and that it is possible to form a uniform pattern.

Described next is a formation method of a mold using the heat-reactive resist according to this Embodiment. A developing solution for the heat-reactive resist material is a glycine solution or a mixed solution of glycine and ammonium oxalate.

The developing solution enables only heated portions to be selectively dissolved. In the heated portions, copper(II) oxide in the heat-reactive resist material are heated by exposure or the like and is thermally decomposed into copper(I) oxide. Also, the heated portions exist in a mixed state of the heated portions and the unheated portions. In other words, it is possible to selectively dissolve copper oxide with a lower valency in a state in which copper oxides with different valencies coexist.

Solvents used in the developing solution are not limited particularly, as long as glycine and ammonium oxalate that are components of the developing solution are dissolved suitably, and it is preferable to use water from the viewpoints of solubility, safety, versatility and cost.

A reaction mechanism of development proceeds by the fact that the component of the developing solution such as glycine and ammonium oxalate in the developing solution shifts to the surface of copper oxide that is the heat-reactive resist material, and subsequently develops the chelating reaction on the solid surface of copper oxide, and that the product finally eliminates. In the mechanism, the rate of the solid-liquid reaction of the copper oxide surface and the developing solution component has the most effect on selectivity, and selectivity is higher as a difference in the reaction rate in the reaction with copper oxides with different valencies is larger. In the case of using glycine as the developing solution, since the reaction with copper (I) oxide is fast but the reaction with copper (II) oxide is extremely slow, it is possible to obtain excellent selectivity. In other words, since the chelating reaction between glycine and copper oxide is a rate-limiting reaction, the effects by the shift of the developing solution component and rate of elimination of the product are less, and it is possible to obtain high uniformity at the same time. As such a developing solution component having high selectivity and uniformity, amino acids are excellent, and from the viewpoints of solubility in water, versatility, cost and the like, glycine is the most excellent. Further, as the advantage of using glycine that is an amino acid, there is the fact that glycine has carboxyl groups and amino groups in the same molecule, and that variations in pH are thereby small due to buffering action. When pH leans to the acid side or leans to the base side, since copper oxide is dissolved due to the effects of acid and base, reductions in selectivity are not only derived, but it is also difficult to obtain an excellent fine pattern shape.

In addition, the concentration of the glycine solution that is the developing solution preferably ranges from 0.01 weight % to 10 weight %. The concentration of 0.01% or more enables a desired development rate to be obtained, and is preferable in terms of productivity. Meanwhile, the concentration of 10% or more does particularly not provide a significant problem, but any remarkable change is not observed in the reaction rate when the concentration exceeds 10%, and therefore, in consideration of the cost, the concentration is preferably 10% or less.

Further, in the case of using only glycine as the developing solution, as described above, in the reaction rate, the increasing tendency of the reaction rate tends to be flat when the additive amount exceeds 10%. Therefore, in such a case, when it is desired to perform development at a faster reaction rate, it is preferable to add a chelating agent to the developing solution separately. As a chelating agent to control the reaction rate, there are various kinds of agents, and with consideration given to high selectivity, solubility in water, versatility, cost and the like, ammonium oxalate is excellent. In other words, in a region in which the reaction rate is slow, it is possible to control the reaction rate by adjusting the concentration of glycine, and in a region in which the reaction rate is fast, it is possible to adjust the reaction rate by adding ammonium oxalate to the glycine solution as appropriate. In addition, any problem does not occur in causing the glycine solution and the mixed solution of glycine and ammonium oxalate to separately act on the heat-reactive resist material. In addition, when the rate of ammonium oxalate is higher than the rate of glycine, a contribution of the reaction between ammonium oxalate and copper oxide controls the entire reaction rate, and therefore, it is preferable that the rate of glycine is higher to maintain desired selectivity. From the above-mentioned viewpoints, the rate of ammonium oxalate is preferably in the range of 0.01 weight % to the concentration of glycine.

Further, by controlling the temperature in causing the developing solution to act on the resist, it is possible to change the development rate. It is possible to set the temperature arbitrarily while avoiding the ranges for causing the developing solution to freeze, boil, or evaporate at rates for remarkably changing the concentration or the component of the developing solution or the resist to decompose. In the range of high temperatures, the reaction rate is fast, the unreacted portions are easy to dissolve, and by shortening the development time as appropriate, it is possible to form a fine pattern without problems. On the other hand, in the range of low temperatures, the reaction rate is slow, the development time required to obtain a desired shape increases, and by developing for a long time, it is possible to form a fine pattern without problems. However, in terms of productivity, about one to several tens of minutes are preferable. Herein, with consideration given from the viewpoint of the selection ratio indicative of the development difference that is one of indexes of manufacturing stability, the ratio has a higher value as the development temperature is lower. However, as described previously, when the development temperature is too low, since the required development time increases, productivity degrades. From the above-mentioned reasons, the temperature preferably ranges from 10° C. to 50° C., more preferably ranges from 15° C. to 40° C., and most preferably ranges from 20° C. to 30° C. in consideration of manufacturing stability, convenience in implementing manufacturing, productivity and the like.

Furthermore, with respect to pH, pH takes a value of approximately 1 to 11 according to glycine and ammonium oxalate to use, is desirably 3.50 or more, preferably 4.00 or more, more preferably 4.50 or more, and particularly preferably 6.00 or more. When pH is less than 3.50, the progression of etching is remarkable other than the complex formation reaction, and there is the case that desired selectivity is not obtained.

In view of the foregoing, according to a combination of the heat-reactive resist material and the developing solution according to this Embodiment i.e. pattern formation material, it is possible to form a fine pattern with extremely high resolution, and to provide stable pattern formation with high productivity.

Accordingly, the pattern formation material of the invention is preferably comprised of a combination of the heat-reactive resist material containing copper oxide and silicon or silicon oxide in an amount of 4.0 mol % or more less than 10.0 mol % as an additive, and the developing solution comprised of the glycine solution or the mixed solution of glycine and ammonium oxalate.

In addition, in formation of a pattern using the heat-reactive resist material of the invention, it is possible to implement both the positive type (the heated portions are dissolved in the developing solution) and the negative type (the unheated portions are dissolved in the developing solution). In the positive type, the heated portions are decomposed, the decomposed portions are dissolved in the developing solution, and it is thereby possible to form a pattern. On the other hand, in the negative type, by using crystal growth developed in applying heat to an extent that copper oxide does not decompose, it is possible to form a pattern. In other words, the unheated portions in which crystal growth proceed little are dissolved in the developing solution, the heated portions in which crystal growth proceed are left due to resistance to the developing solution, and it is thereby possible to form a pattern.

Thus, according to the heat-reactive resist material according to this Embodiment, by controlling an amount of heat to provide, it is possible to form the positive type and negative type of patterns.

Described next is a method of manufacturing a mold using the heat-reactive resist material according to this Embodiment.

Step (1) Form a heat-reactive resist layer on a substrate.

Step (2) Expose the heat-reactive resist layer, and then, develop with the developing solution comprised of the glycine solution or mixed solution of glycine and ammonium oxalate.

Step (3) Perform dry etching processing on the substrate with a fluorocarbon using the developed heat-reactive resist as a mask to form a fine pattern.

Step (4) Remove the heat-reactive resist to manufacture a mold.

In the case of forming the film of the heat-reactive resist layer, preferable is film formation using a sputtering method, vapor deposition method and CVD method. Since the heat-reactive resist material allows fine pattern processing of the level of several tens of nanometers, depending on the fine pattern size, it is conceivable that the film thickness distribution and concavities and convexities on the surface of the heat-reactive resist material in film formation have extremely significant effects. Therefore, to reduce these effects as much as possible, it is preferable to form the heat-reactive resist material by the film formation method such as the sputtering method, vapor deposition method and CVD method rather than a film formation method such as a coating method and spray method with control of the uniformity of the film thickness being a little difficult.

It is possible to provide the heat-reactive resist layer with heat release design as necessary. The heat release design is designed when the need arises for releasing heat from the heat-reactive resist material as rapidly as possible. For example, the heat release design is performed when the reaction by heat proceeds, by heat filling, in an area wider than the spot shape of the thermal reaction due to exposure. As the heat release design, it is possible to adopt a laminate structure in which a film of a material with thermal conductivity higher than that of air is deposited above the heat-reactive resist material or adopt a laminate structure in which a film of a material with thermal conductivity higher than that of the substrate is deposited below the heat-reactive resist material.

Described next is a development method using the developing solution according to this Embodiment. The development method includes an exposure step of thermally decomposing copper oxide forming the heat-reactive resist material, and a development step of supplying the developing solution to the heat-reactive resist layer and removing an oxide of copper that is thermally decomposed from the heat-reactive resist layer.

Figure 3:
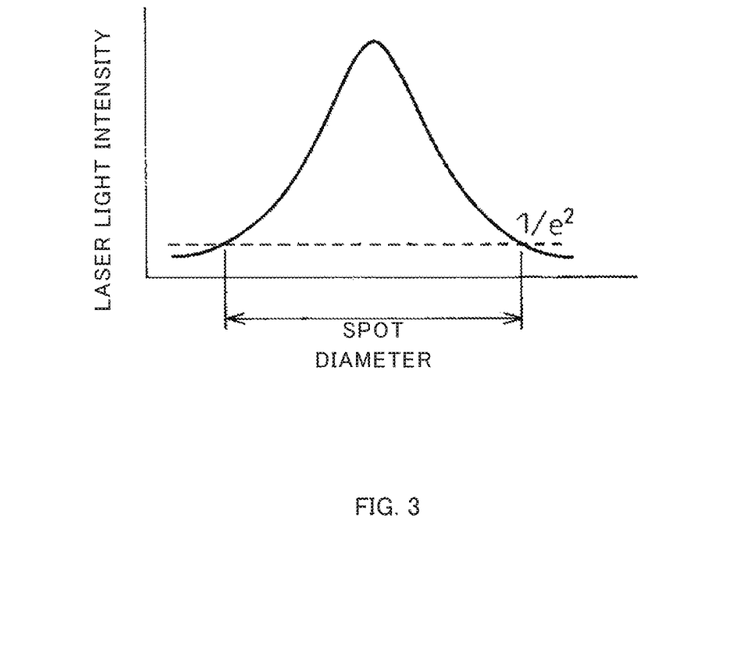
FIG. 3 is a graph showing an intensity distribution of laser light.
Figure 4:
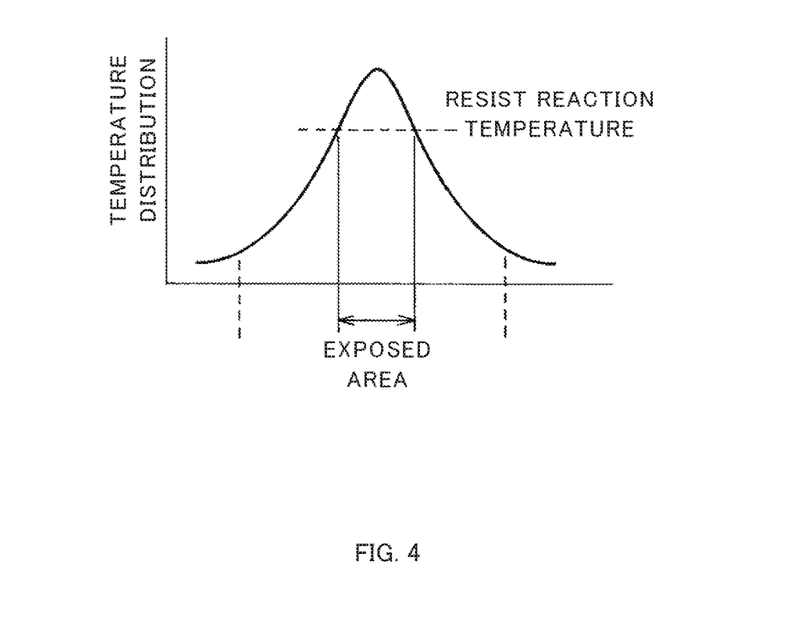
FIG. 4 is a graph showing a temperature distribution of a portion irradiated with laser light.

In a thermal decomposition step, by applying heat of a predetermined temperature or more to a predetermined area of the heat-reactive resist layer, an oxide of copper is thermally decomposed in the predetermined area of the heat-reactive resist layer. Further, in the thermal decomposition step, it is preferable to perform thermal decomposition of the heat-reactive resist layer by irradiating the heat-reactive resist layer with laser light. When a substance is irradiated with laser light having the distribution as shown in FIG. 3, the temperature of the substance also shows the same Gaussian distribution as the intensity distribution of the laser light (see FIG. 4). By applying the laser light to the predetermined area of the heat-reactive resist layer, since temperatures inside the predetermined area of the heat-reactive resist layer are made the Gaussian distribution, the reaction proceeds only in the portion becoming the predetermined temperature or more, and it is made possible to thermally decompose the range smaller than the spot diameter of the laser light. In addition, in thermal decomposition, the source is not limited to laser light, as long as it is possible to decompose copper oxide with the source by applying heat of a predetermined temperature or more to a predetermined area of the heat-reactive resist layer.

In the development step, the developing solution is supplied to the heat-reactive resist layer to dissolve and remove an oxide of copper in the predetermined area of the heat-reactive resist layer. In the heat-reactive resist layer subsequent to the thermal decomposition step coexist the oxide of copper that is not thermally decomposed and the oxide of copper reduced in the oxidation number by thermal decomposition. Glycine and ammonium oxalate in the developing solution selectively chelation-react with the oxide of copper reduced in the oxidation number by thermal decomposition, and it is thereby possible to selectively remove the oxide of copper in the copper oxide area that is thermally decomposed from the heat-reactive resist layer.

In addition, the method of causing the developing solution to act on the heat-reactive resist layer is not limited particularly, and the heat-reactive resist layer may be immersed in the developing solution, or the developing solution may be sprayed onto the heat-reactive resist layer. By circulating the solution in immersing the heat-reactive resist layer in the developing solution or operating the heat-reactive resist layer, increased is an amount of the solution contacting the heat-reactive resist layer per unit time, and it is possible to increase the development rate. Further, by increasing the spray pressure in spraying the developing solution onto the heat-reactive resist layer, it is possible to increase the development rate. In the case of spraying the developing solution onto the heat-reactive resist layer, it is also possible to use a method of moving the nozzle, a method of rotating the heat-reactive resist layer or the like alone, and using the methods together enables development to proceed uniformly and therefore, is preferable. It is possible to use an arbitrary type of nozzle used in spray, examples thereof are a line slit, full-cone nozzle, hollow-cone nozzle, flat nozzle, uniform flat nozzle, and solid nozzle, and it is possible to select in accordance with the heat-reactive resist layer and the shape of the substrate. Further, it is possible to use a one liquid nozzle or two liquid nozzle.

In causing the developing solution to act on the heat-reactive resist layer, when any impurity such as insoluble fine powder exists in the developing solution, there is the risk of being a cause of unevenness particularly in developing a fine pattern, and therefore, it is preferable to filter the developing solution in advance. As a material of a filter used in filtration, it is possible to select a material arbitrarily, as long as the material does not react with the developing solution, and examples thereof are PFA and PTFE. The roughness of the mesh of the filter is capable of being selected corresponding to the degree of fineness of the pattern, is 0.2 μm or less, and is more preferably 0.1 μm or less. Further, in order to prevent precipitation and reattachment of an eluted component, spray is preferred to immersion, and furthermore, in spraying the developing solution onto the heat-reactive resist layer, it is desirable to dispose the developing solution after one-time use. In reusing the developing solution, it is preferable to remove the eluted component.

The development method preferably includes a step of cleaning the heat-reactive resist layer, and a step of cleaning the substrate and heat-reactive resist layer subjected to development.

The shape of the mold is capable of being made the shape of a plate or the shape of a sleeve (roll, drum). Many molds used in a disk of an optical disk and nanoimprint are small in the shape of a plate, and it is possible to transfer with a simplified apparatus. On the other hand, the shape of a sleeve has a property of enabling the pattern to be transferred in a large area.

Substrates to manufacture the mold do particularly not undergo limitations in the material. However, preferable are materials that are excellent in surface smoothness and workability and that allow dry etching processing. As a typical material of such materials, it is possible to use glass. Further, it is possible to use silicon, silicon dioxide or the like as the substrate. Furthermore, by providing a dry etching layer as described later, it is possible to use aluminium, titanium, copper, silver, gold or the like. Among the materials, from the viewpoint of the dry etching processing, quartz glass is suitable as the substrate, and by controlling only the time of the dry etching processing, it is possible to form a desired aspect ratio.

Before manufacturing the mold, it is preferable to clean the substrate to manufacture the mold. It is possible to select a cleaning method as appropriate according to the used material and shape. For example, when the material of the substrate is glass, it is possible to clean using an alkali cleaning liquid such as inorganic alkali and organic alkali, or an acidic cleaning liquid such as hydrofluoric acid. Further, when the cleaning-targeted substance is hard to remove from the substrate or the cleaning-targeted substance removed from the substrate reattaches, it is possible to select addition of a surfactant, heating of the cleaning liquid, scrub cleaning, ultrasonic cleaning and the like as appropriate.

Subsequent to cleaning of the substrate, it is preferable to dry the substrate. It is possible to select a drying method as appropriate according to the used material and shape. For example, in order to suppress the occurrence of a stain such as a watermark, it is preferable to use isopropyl alcohol (IPA) drying, oven drying, hot-water lift drying, air-knife drying or the like. Particularly, when the substrate to manufacture the mold is in the shape of a sleeve, it is preferable to use IPA drying, hot-water lift drying, air-knife drying or the like. In addition, when the material used in the substrate is a composite material, it is preferable to select cleaning and drying methods adaptable to materials of the composite material. For example, when the substrate is in the shape of a sleeve, a core material is carbon-fiber reinforced plastic, and the surface is quartz glass, preferable as a cleaning agent is an alkali cleaning liquid, and preferable as a drying method is hot-water lift drying and air-knife drying.

In mold manufacturing, as well as the configuration in which the film of the heat-reactive resist material is directly formed on the substrate, it is possible to make a configuration in which an etching layer is provided between the substrate and the heat-reactive resist layer separately. As an etching material forming the etching layer, it is preferable to select from among materials comprised of elements such that the boiling point of the primary fluoride is 250° C. or less. More specifically, preferable are materials selected from the group consisting of Ta, Mo, W, C, Si, Ge, Te, P, composites of two or more kinds thereof, oxides thereof, nitrides thereof, sulfides thereof, and carbon oxides thereof. More preferable are $SiO_2$, Si and $Si_3N_4$. In addition, as a film thickness of the etching layer, by forming the film in a thickness of a desired pattern depth, it is possible to control a processing depth of a pattern.

The fluorocarbons used in the dry etching processing in manufacturing the mold are not limited particularly, examples thereof include fluorocarbons such as $CF_4$, $CHF_3$, $CH_2F_2$, $C_2F_6$, $C_3F_8$, $C_4F_6$, $C_4F_8$, $C_4F_{10}$, $C_5F_{10}$, $CCl_2F_2$ and $ClF_3$, and these gases may be used alone or in combination of a plurality of gases. Further, the fluorocarbons may be mixed gases obtained by mixing $O_2$, $H_2$, Ar, $N_2$, CO or the like into these fluorocarbons. Moreover, the scope of the fluorocarbons includes mixed gases of HBr, $NF_3$, $SF_6$, $CF_3Br$, HCl, HI, $BBr_3$, $BCl_3$, $Cl_2$ and $SiCl_4$, and the mixed gases mixed with gases of Ar, $O_2$, $H_2$, $N_2$, CO and the like.

Further, by optimizing the conditions of the type of etching gas as described previously, composition, etching pressure and temperature, it is possible to control resistance of the resist mask, and the etching direction of the substrate and etching layer. For example, there are a method of adding Ar to a fluorocarbon etching gas, thereby controlling the degree of dissociation of the fluorocarbon, and increasing/decreasing the etching rate of the substrate, etching layer and heat-reactive resist layer, and another method of controlling the molar ratio of F and C of a fluorocarbon to use, controlling the pressure of the dry etching processing, and thereby controlling the etching direction from the perpendicular direction to the slanting direction to manufacture a desired mold shape.

An apparatus used in the step of performing the dry etching processing is not limited particularly, as long as the apparatus is capable of introducing a fluorocarbon in a vacuum, forming plasma and performing the etching processing, and it is possible to use commercially available dry etching apparatuses, RIE apparatuses, and ICP apparatuses. It is possible to determine the species of gas, time, power and the like to perform the dry etching processing as appropriate corresponding to the type of the resist material, type of the etching layer, thickness of the etching layer, etching rate of the etching layer and the like.

In the process of manufacturing the mold, it is necessary to remove the heat-reactive resist material from the substrate to manufacture the mold. The method of removing the heat-reactive resist material is not limited particularly unless the substrate and etching layer are affected, and for example, it is possible to use wet etching and dry etching.

For example, in the case of using quartz glass for the substrate to manufacture the mold, by using a general acid, it is possible to remove the heat-reactive resist material with ease by wet etching. More specifically, examples of the acid are hydrochloric acid, nitric acid, sulfuric acid, and phosphoric acid. A method of causing the acid to act on the heat-reactive resist material is not limited particularly, and it is possible to use the same method as the method of causing the developing solution to act as described previously without problems.

Further, it is preferable to include the step of cleaning the substrate after removing the heat-reactive resist material.

As the laser used in exposure, it is possible to use excimer lasers such as KrF and ArF lasers, semiconductor lasers, electron beam and X-ray. The excimer lasers such as KrF and ArF lasers are very large-size expensive apparatuses, electron beam and X-ray require using a vacuum chamber, and there are significant limitations from the viewpoints of cost and large size. Accordingly, it is preferable to use semiconductor lasers that enable the light-source apparatus to be extremely small-size and that are inexpensive.

In general, it is made possible to forma fine pattern by reducing the wavelength of the exposure light source using the electron beam, excimer laser, or the like, and the heat-reactive resist material according to this Embodiment enables a fine pattern to be formed adequately even using the semiconductor laser.

In the present invention, by using the methods of manufacturing a mold, it is possible to manufacture a mold having a fine pattern in the range of 1 nm to 1 μm. In addition, in the method of manufacturing a mold according to the invention, it is preferable to use the shape of a sleeve and the shape of a plate as the substrate.

The present invention will specifically be described below using Examples and Comparative Example performed to clarify the effects of the invention. In addition, any limitation is not imposed on the invention by the following Examples.

(LER)

LER (Line Edge Roughness) is an index indicative of fluctuations in the pattern, and represents roughness of the pattern edge shape i.e. the size of concavities and convexities generated in the pattern edge portion. As a value of LER is lower, it is indicated that fluctuations in the pattern shape are smaller. LER was derived from an image obtained by performing surface SEM (Scanning Electron Microscope) observation of the resist subjected to development, according to SEMI P47-0307 as described in SEMI International Standards.

Example 1

On a quartz glass substrate with 2 in Φ and thickness of 0.5 mm was formed a film with a film thickness of 25 nm of each of heat-reactive resist materials of Samples 1-a to 1-d containing copper oxide and silicon or silicon oxide in different additive amounts of silicon or silicon oxide as an additive by the sputtering method. Each of the deposited heat-reactive resist layers was analyzed using fluorescent X-rays, and the additive amounts of silicon were values (in Table 1, described as Si additive amount (unit: mol %)) as shown in Table 1.

TABLE 1

| | SAMPLE | ADDITIVE | DEPOSITION Si ADDITIVE AMOUNT [mol %] | FILM THICKNESS [nm] | Development SOLUTION SPECIES | CONCENTRATION [wt %] | TIME [min] | TEMPARATURE [° C.] | Pattern SHAPE | OPENING WIDTH [nm] | LER [nm] | ETCHING DEPTH [nm] |
|---|---|---|---|---|---|---|---|---|---|---|---|---|
| EXAMPLE 1 | 1-a | Si | 6.5 | 25 | MIXED SOLUTION | 0.3 + 0.3 | 5 | 23 | GROOVE SHAPE | 307 | 3 | 375 |
| | 1-b | | 7.5 | | | | | | | 318 | 2 | |
| | 1-c | | 8.5 | | | | | | | 330 | | |
| | 1-d | SiO₂ | 7.5 | | | | | | | 91 | | |
| COMPARATIVE EXAMPLE 1 | 2-a | Si | 2.0 | | | | | | | 87 | 5 | |
| | 2-b | | 20 | | | | | | | 145 | — | |
| EXAMPLE 2 | 3-a | | 7.5 | 20 | | | | | CIRCULAR SHAPE | 250 | | 300 |
| | 3-b | | | 30 | | | | | | 315 | | |
| EXAMPLE 3 | 4-a | SiO₂ | | 5 | | | | | | 200 | | 375 |
| | 4-b | | | 120 | | | | | | 370 | | |
| EXAMPLE 4 | 5 | Si | | 25 | GLYCINE MIXED SOLUTION | 0.3 | | | | 300 | | |
| EXAMPLE 5 | 6-a | | | | | 0.1 | | | | 91 | | |
| | 6-b | | | | | 1 | | | | 91 | | |
| | 6-c | | | | | 15 | | | | 91 | | |
| EXAMPLE 6 | 7 | | | | | 0.001 | 10 | | | 85 | | — |
| EXAMPLE 7 | 8-a | | | | | 0.3 + 0.3 | 5 | | | 95 | | 375 |
| | 8-b | | | | | | 7 | | | 106 | | |
| | 8-c | | | | | | 10 | | | 126 | | |
| EXAMPLE 8 | 9-a | | | | | | 5 | 15 | | 87 | | |
| | 9-b | | | | | | | 30 | | 101 | | |
| | 9-c | | | | | | | 40 | | 115 | | |
| | 9-d | | | | | | 1 | 50 | | 121 | | |
| EXAMPLE 9 | 10 | | | | | | | 60 | | — | | — |
| EXAMPLE 10 | 11 | | | | A | B | 2 | 23 | | | | |
| EXAMPLE 11 | 12-a | | 4.0 | | MIXED SOLUTION | 0.3 + 0.3 | 5 | | | 298 | 4 | 375 |
| | 12-b | | 9.0 | | | | | | | 335 | 2 | |
| | 12-c | | 9.5 | | | | | | | 337 | | |

The heat-reactive resist layers deposited as described above were developed on the following conditions.

Wavelength of semiconductor laser for exposure: 405 nm
Lens aperture: 0.85
Exposure laser power: 1 mW~25 mV
Feed pitch: 120 nm~800 nm
Exposure rate: 0.88 m/s~7.0 m/s In Example 1, a groove-shaped pattern was used as a pattern shape. It is possible to prepare various shapes and patterns by modulating the intensity of the laser during development. In the experiments, to check exposure accuracy, consecutive groove shapes and isolated circular shapes were used as a pattern. The shape to form may be an elliptical shape according to the intended use, and the present invention does not undergo any limitation by the exposure shape.

Subsequently, each of the heat-reactive resist layers exposed by the above-mentioned exposure apparatus was developed. The developing solution was made on the conditions as shown in Table 1. In addition, in Table 1, "mixed solution" represents a mixed aqueous solution of glycine and ammonium oxalate. Further, "0.3+0.3" represents that 0.3 wt % of glycine and 0.3 wt % of ammonium oxalate were mixed. As the development time, to ensure manufacturing stability, development was carried out for 5 minutes. In addition, the selection ratio in this case was 25, and thus extremely high.

With respect to thus developed heat-reactive resist layers, when the surface shape and cross-sectional shape were observed by SEM (Scanning Electron Microscope), the opening widths (nm) as shown in Table 1 were formed as a groove-shaped pattern. Further, LER were 3 nm (Sample 1-a, Si=6.5 mol %), 2 nm (Sample 1-b, Si=7.5 mol %), 2 nm (Sample 1-c, Si=8.5 mol %) and 2 nm (Sample 1-d, $SiO_2$=7.5 mol %), and showed remarkably excellent roughness.

Next, using the obtained heat-reactive resists as the mask, etching of the quartz glass substrates was performed by the dry etching processing. Dry etching was carried out using $SF_6$ as an etching gas on the conditions that the processing gas pressure was 5 Pa, processing power was 300 W, and that the processing time was 10 minutes. When observation by SEM was performed on cross-sectional shapes obtained by peeling off only the heat-reactive resists from the substrates provided with the patterns, the etching layer depth (nm) as shown in Table 1 was observed, the etching layer reflected the width shape of the mask, and the groove-shaped pattern was formed.

Using each substrate with the pattern obtained as described above as a mold, the surface shape was transferred to a film using a UV curable resin, and an almost mold-inversed shape was transferred onto the film.

Comparative Example 1

As shown in Table 1, molds were manufactured on the same conditions as in Example 1 except that the silicon amount added to the heat-reactive resist material was 2.0 mol % or 20.0 mol %. The surface shapes of the obtained molds were observed by SEM. When the silicon amount to add was 2.0 mol % and small (Sample 2-a), LER was 5 nm, crystal growth of copper oxide was not suppressed much, and roughness of the groove-shaped pattern was poorer than in Example 1 with large Si additive amounts. On the other hand, when the silicon amount to add was 20.0 mol % and large (Sample 2-b), the selection ratio was 2 and low, the development difference between the exposed portion and the unexposed portion was small in development, and the Sample lacked stability in manufacturing.

By comparing Example 1 with Comparative Example 1, it is understood that it is possible to form a pattern with stability in manufacturing by using the heat-reactive resist materials and developing solution according to Example 1.

Example 2

On a quartz glass roll substrate with 080 mm and length of 400 mm was formed a film of each of heat-reactive resist materials containing copper oxide and silicon by the sputtering method in a thickness as shown in Table 1 (Samples 3-a and 3-b).

Each of the deposited heat-reactive resist layers was analyzed using fluorescent X-rays, and the additive amounts of silicon were values as shown in Table 1.

The heat-reactive resist layers deposited as described above were developed on the following conditions.
Wavelength of semiconductor laser for exposure: 405 nm
Lens aperture: 0.85
Exposure laser power: 1 mW~25 mV
Feed pitch: 120 nm~800 nm
Rotation speed: 210~1670 rpm In addition, in Example 2, a circular pattern was used as a pattern shape.

Subsequently, each of the heat-reactive resists exposed by the above-mentioned exposure apparatus was developed. The developing solution was made on the conditions as shown in Table 1. As the development time, to ensure manufacturing stability, development was carried out for 5 minutes.

Next, using the obtained heat-reactive resists as the mask, etching of the quartz glass rolls was performed by the dry etching processing. Dry etching was carried out using $SF_6$ as an etching gas on the conditions that the processing gas pressure was 3 Pa, processing power was 1000 W, and that the processing time was 5 minutes.

Using each of products obtained by peeling off only the heat-reactive resist layers from the substrates provided with these pattern as molds, the surface shape was transferred to a film using a UV curable resin, and when the surface shape and cross-sectional shape were observed by SEM, the opening width (nm) and etching layer depth (nm) as shown in Table 1 were observed.

Example 3

As shown in Table 1, molds were manufactured on the same conditions as in Sample 1-d of Example 1 except that the film thickness of the heat-reactive resist material was 5 nm (Sample 4-a) or 120 nm (Sample 4-b) and that a circular pattern was used. The surface shapes of the obtained molds were observed by SEM, and when the film thickness was 5 nm and thin (Sample 4-a), by increasing exposure laser power, it was possible to form an isolated circular pattern. On the other hand, when the film thickness was 120 nm and thick (Sample 4-b), since diffusion of heat was large in the film surface direction, it was possible to form an isolated circular pattern with a large opening width.

By comparing Example 2 with Example 3, it is understood that it is possible to form a pattern with more stability in manufacturing due to the film thickness of the heat-reactive resist layer according to Example 3.

Example 4

As shown in Table 1, a mold was manufactured on the same conditions as in Sample 1-b of Example 1 except that the type of the developing solution was a glycine aqueous solution and that a circular pattern was used (Sample 5). When the surface shape of the obtained mold was observed by SEM, the opening width (nm) as shown in Table 1 was formed as an isolated circular pattern.

Example 5

As shown in Table 1, molds were manufactured on the same conditions as in Sample 1-d of Example 1 except that the concentration of the developing solution was 0.1%, 1% or 15% (Samples 6-a to 6-c). When the surface shape of each of the obtained molds was observed by SEM, an isolated circular pattern having the opening width (nm) as shown Table 1 was formed. By this means, it is possible to confirm that the opening width does not vary at all depending on the concentration of the developing solution, and it is understood that it is possible to form a pattern with stability in manufacturing.

Example 6

As shown in Table 1, a mold was manufactured on the same conditions as in Sample 1-d of Example 1 except that the concentration of the developing solution was 0.001% and that the development time was 10 minutes (Sample 7). When the surface shape of the obtained mold was observed by SEM, the portion in which the resist layer was dissolved did not reach the substrate side, and it is possible to form a pattern by further extending the time.

Example 7

As shown in Table 1, molds were manufactured on the same conditions as in Sample 1-b of Example 1 except that the development time was 5 minutes, 7 minutes or 10 minutes and that a circular pattern was used (Samples 8-a to 8-c). When the surface shape of each of the obtained molds was observed by SEM, the opening width (nm) as shown in Table 1 was formed as an isolated circular pattern. Patterns of excellent shapes were obtained in respective samples.

Example 8

As shown in Table 1, molds were manufactured on the same conditions as in Sample 1-b of Example 1 except that the temperature of the developing solution was 15° C., 30° C. or 40° C. and that a circular pattern was used (Samples 9-a to 9-c). When the surface shape of each of the obtained molds was observed by SEM, the opening width (nm) as shown in Table 1 was formed as an isolated circular pattern. Further, as shown in Table 1, a mold was manufactured on the same conditions as in Sample 1-b of Example 1 except that the temperature of the developing solution was 50° C., the development time was 1 minute and that a circular pattern was used (Sample 9-d). When the surface shape of the obtained mold was observed by SEM, the opening width (nm) as shown in Table 1 was formed as an isolated circular pattern. In addition, the selection ratios in this case were respectively 27 (Sample 9-a, 15° C.), 20 (Sample 9-b, 30° C.), 10 (Sample 9-c, 40° C.) and (Sample 9-d, 50° C.), and were thus high.

Example 9

As shown in Table 1, a mold was manufactured on the same conditions as in Sample 1-b of Example 1 except that the temperature of the developing solution was 60° C., the development time was 1 minute and that a circular pattern was used (Sample 10). When the surface shape of the obtained mold was observed by SEM, most of the resist layer was dissolved, and by further shortening the development time to 0.5 minute, it is possible to form a pattern. In addition, the selection ratio in this case was measured by shortening the development time separately, and was 1.5.

By comparing Example 8 with Example 9, according to the temperatures of the developing solutions according to Example 8, it is understood that it is possible to form a pattern with more stability in manufacturing.

Example 10

As shown in Table 1, a mold was manufactured on the same conditions as in Sample 1-b of Example 1 except that the composition of the developing solution was changed, the development time was 2 minutes and that a circular pattern was used (Sample 11). In addition, the solution species A of the developing solution in Table 1 were comprised of glycine, fluorinated ammonium, 1-hydroxy ethylidene-1,1-diphosphonic acid and phosphonic acid, and as solvents, propylene glycol monomethyl ether and water. As the concentration B, glycine was 0.9 wt %, fluorinated ammonium was 0.04 wt %, 1-hydroxyethylidene-1,1-diphosphonic acid was 0.06 wt % and phosphonic acid was 0.004 wt %, and pH was 2.6.

When the surface shape of the obtained mold was observed by SEM, most of the resist layer was dissolved, and by further shortening the development time to 0.25 minute, it is possible to form a pattern.

Example 11

As shown in Table 1, molds were manufactured on the same conditions as in Sample 1-b of Example 1 except that the silicon amount added to the heat-reactive resist material was 4.0 mol % (Sample 12-a), 9.0 mol % (Sample 12-b) or 9.5 mol % (Sample 12-c) and that a circular pattern was used. The surface shape of each of the obtained molds was observed by SEM, and when the silicon amount to add was 4.0 mol %, LER was 4 nm. On the other hand, when the silicon amount to add was 9.0 mol % or 9.5 mol %, the development selection ratio was 23 or 21, respectively.

As can be seen from the Examples and Comparative Example as described above, by adding silicon or silicon oxide to copper oxide within the range of 4.0 mol % or more less than 10.0 mol %, it is possible to obtain heat-reactive resist materials that enable excellent pattern roughness formation and finer pattern formation and that are extremely excellent in manufacturing stability in the case of repetition reproducibility, development of a large area and the like.

INDUSTRIAL APPLICABILITY

According to the heat-reactive resist pattern materials according to the present invention, pattern roughness of the resist is excellent, the development difference between the heated portion and the unheated portion is large to enable a fine pattern to be formed with stability, and it is thereby possible to perform stable manufacturing.

The invention claimed is:

1. A pattern formation material comprising a combination of a heat-reactive resist material and a developing solution, wherein
the heat-reactive resist material contains copper oxide, and silicon or silicon oxide,
the developing solution comprises glycine solution or a mixed solution of glycine and ammonium oxalate, the glycine solution and the glycine being an amino acid solution and an amino acid, respectively, and
a Si additive amount of the silicon or the silicon oxide in the heat-reactive resist material ranges from 4.5 mol % to 9.5 mol % in the total moles of copper (Cu) and silicon (Si).

2. The pattern formation material according to claim 1, wherein
the content of the silicon or the silicon oxide in the heat-reactive resist material ranges from 5.5 mol % to 8.5 mol % in the total number of moles of copper (Cu) and silicon (Si).

3. The pattern formation material according to claim 1, wherein the content of the silicon or the silicon oxide in the heat-reactive resist material ranges from 6.5 mol % to 8.5 mol % in the total number of moles of copper (Cu) and silicon (Si).

\* \* \* \* \*